United States Patent
Gulino et al.

(10) Patent No.: US 11,842,974 B2
(45) Date of Patent: Dec. 12, 2023

(54) SOLDER MATERIAL AND METHOD FOR DIE ATTACHMENT

(71) Applicant: Alpha Assembly Solutions Inc., Waterbury, CT (US)

(72) Inventors: Angelo Gulino, Cranbury, NJ (US); Bogdan Bankiewicz, Philadelphia, PA (US); Oscar Khaselev, Monmouth Junction, NJ (US); Anna Lifton, Bridgewater, NJ (US); Michael T. Marczi, Chester, NJ (US); Girard Sidone, Bordentown, NJ (US); Paul Salerno, Bridgewater, NJ (US); Paul J. Koep, Madison, NJ (US)

(73) Assignee: Alpha Assembly Solutions Inc., Waterbury, CT (US)

( * ) Notice: Subject to any disclaimer, the term of this patent is extended or adjusted under 35 U.S.C. 154(b) by 724 days.

(21) Appl. No.: 16/612,883

(22) PCT Filed: May 11, 2018

(86) PCT No.: PCT/US2018/032325
§ 371 (c)(1),
(2) Date: Nov. 12, 2019

(87) PCT Pub. No.: WO2018/209237
PCT Pub. Date: Nov. 15, 2018

(65) Prior Publication Data
US 2020/0203304 A1 Jun. 25, 2020

Related U.S. Application Data

(60) Provisional application No. 62/505,463, filed on May 12, 2017.

(51) Int. Cl.
*H01L 23/00* (2006.01)
*B23K 35/26* (2006.01)
(Continued)

(52) U.S. Cl.
CPC ............ *H01L 24/29* (2013.01); *B23K 35/262* (2013.01); *B23K 35/302* (2013.01); *C22C 13/00* (2013.01);
(Continued)

(58) Field of Classification Search
CPC ..... H01L 24/26; H01L 2224/26–33519; H01L 2224/83–83986; H01L 24/10–17;
(Continued)

(56) References Cited

U.S. PATENT DOCUMENTS

| 5,088,007 A | 2/1992 | Missele |
| 5,127,969 A | 7/1992 | Sekhar |

(Continued)

FOREIGN PATENT DOCUMENTS

| CN | 102554488 A | 7/2012 |
| JP | 2005288526 A | 10/2005 |
| JP | 2013018010 A | 1/2013 |

OTHER PUBLICATIONS

International Search Report of the International Searching Authority for PCT/US2018/032325 dated Aug. 8, 2018.

*Primary Examiner* — Amar Movva
(74) *Attorney, Agent, or Firm* — Stinson LLP

(57) ABSTRACT

A solder material comprising a solder alloy and a thermal conductivity modifying component. The solder material has a bulk thermal conductivity of between about 75 and about 150 W/m-K and is usable in enhancing the thermal conductivity of the solder, allowing for optimal heat transfer and reliability in electronic packaging applications.

13 Claims, 2 Drawing Sheets

(51) Int. Cl.
*B23K 35/30* (2006.01)
*C22C 13/00* (2006.01)
*B23K 101/42* (2006.01)

(52) U.S. Cl.
CPC .......... *H01L 24/83* (2013.01); *B23K 2101/42* (2018.08); *H01L 2224/29209* (2013.01); *H01L 2224/29211* (2013.01); *H01L 2224/29216* (2013.01); *H01L 2224/29239* (2013.01); *H01L 2224/29247* (2013.01); *H01L 2224/29311* (2013.01); *H01L 2224/29324* (2013.01); *H01L 2224/29339* (2013.01); *H01L 2224/29347* (2013.01); *H01L 2224/29355* (2013.01); *H01L 2224/29364* (2013.01); *H01L 2224/29369* (2013.01); *H01L 2224/83815* (2013.01); *H01L 2924/014* (2013.01); *H01L 2924/0105* (2013.01); *H01L 2924/01013* (2013.01); *H01L 2924/01028* (2013.01); *H01L 2924/01029* (2013.01); *H01L 2924/01046* (2013.01); *H01L 2924/01047* (2013.01); *H01L 2924/01049* (2013.01); *H01L 2924/01078* (2013.01); *H01L 2924/01082* (2013.01)

(58) Field of Classification Search
CPC .......... H01L 2224/10–17519; H01L 2224/81–81986; H01L 23/488–49894; H01L 23/3736; H01L 23/3738
See application file for complete search history.

(56) References Cited

U.S. PATENT DOCUMENTS

| | | | |
|---|---|---|---|
| 6,523,608 | B1 | 2/2003 | Solbrekken et al. |
| 9,468,136 | B2 | 10/2016 | Ross et al. |
| 2002/0175403 | A1* | 11/2002 | Sreeram ............ B23K 35/3602 257/702 |
| 2002/0190388 | A1 | 12/2002 | Eytcheson |
| 2004/0188814 | A1* | 9/2004 | Houle ................ H01L 23/42 438/106 |
| 2004/0200879 | A1 | 10/2004 | Lewis et al. |
| 2007/0013054 | A1 | 1/2007 | Ruchert et al. |
| 2011/0038124 | A1 | 2/2011 | Burnham et al. |
| 2011/0096507 | A1* | 4/2011 | Deram ................ H01L 23/42 228/141.1 |
| 2011/0265979 | A1 | 11/2011 | Chen et al. |

* cited by examiner

SOLDER MATERIAL AND METHOD FOR DIE ATTACHMENT

FIELD OF THE INVENTION

The present invention relates generally to a solder material for use in electronic packaging containing a thermal conductivity modifying component to enhance heat dissipation of the electronic device and enhance its reliability.

BACKGROUND OF THE INVENTION

In order for a semiconductor device to be used in an electronic product, it must be electrically, mechanically and, in some cases, thermally interconnected to a semiconductor package. This mechanical interconnection can be achieved using an adhesive material (e.g. a polymer material) in paste or film form. Electrical connection can be achieved by attaching thin gold wires or tabs between electrical outputs of the semiconductor device and inputs of the semiconductor package. When thermal conduction is required, such as for power devices, one conventional strategy involves replacing the polymer mechanical adhesive with a solder that is disposed between the semiconductor device and semiconductor package at the time of assembly.

Solder paste is the most recognized form of solder used in electronics assembly. A surface mount application typically depends on solder paste to attach the components to the circuit board. However, solder paste may not be the only solution. This is especially true when working with through-hole components or very large devices that require more solder than can be supplied by printed solder paste. Quite often a printed circuit board involves mixed technology that requires more than one form of solder. Thus, solder paste may be used for surface mount components and solder preforms may be used to attach the leads on through-hole components.

Solder preforms are formed shapes of solder that are designed to be extremely uniform, with each preform consistently delivering the same volume of solder to the joint. Solder preforms can also be formed into a variety of shapes and sizes to fit specific requirements, including washers, discs, squares, rectangles, and frames, with sizes ranging from extremely small to quite large, depending on the solder volume needed to complete the joint. These shapes can also be connected with narrow strands of solder for use when multiple preforms are being applied in a specific pattern. The strands are designed to break apart at the moment of reflow and wick back to the solder mass, allowing for faster and more accurate placement.

Solder preforms can also be used in combination with solder paste to fortify a solder joint. For example, it may be desirable to use a preform if the solder paste does not provide enough solder volume to meet the joint's strength and coverage requirements.

There is also a continuous pressure in the industry to reduce cost, increase throughput and yield, and increase the performance and reliability of packaged semiconductor devices.

Die-attach materials, which are typically solders or filled polymeric materials, are used to connect semiconductor die to lead-frames, other die, heat sinks and the like. The fillers may be electrically conductive or non-conductive depending on the requirements of the connection. Previously, die-attach materials primarily provided a mechanical bond. However, as semiconductor devices have advanced to more complex and powerful uses, they have also become more heat-generating during operation, and conduction of waste heat has become a desirable feature of the die-attach material.

For high power applications, solder is the die-attach material of choice due to its high thermal conduction. However, solders have some detrimental characteristics as well. One major drawback to solders is that solders have a tendency to form voids in the bond line, both during die bonding and during subsequent thermal excursions. These voids create hot spots of poor thermal conductivity under the die and increase the requirement for post-bonding inspection to ensure acceptable results.

High temperature solder alloys are extensively used in die attachment applications, power semiconductor and optical device packaging, flip-chip packaging, heat-sink joining, and other applications where dissipation of heat generated during operation is important. Solder materials enable bonding of heat generating electronic devices to a substrate to create mechanical and electrical connections.

Current industry standard solders for these applications typically require high-lead solders (e.g., 90-95 wt. % Pb) and Au-based eutectic solder alloys (e.g., 80Au20Sn solder). The die attach process generally involves connecting a silicon die or chip to a lead frame or other substrate using adhesive bonding or solder joining. Soldering is a preferred method for attaching a die to a lead frame, especially for power devices due to the higher current carrying capability and better thermal conductivity of a solder alloy as compared with a polymeric adhesive, which is beneficial in dissipating the heat generated by the device.

Solders used for die attach typically have a liquidus temperature of at least 280° C. to allow for subsequent mounting of packaged devices on printed circuit boards with eutectic SnPb or lead-free SnAgCu (SAC) solders by reflow soldering at a temperature of 200 to 250° C.

The most widely used solders for die attachment include high-Pb alloys, e.g., 95Pb5Sn, 88Pb10Sn2Ag, and 92.5Pb5Sn2.5Ag. However, the use of lead is banned in many applications due to its toxicity. Although the high-Pb solder alloys for the first level packaging applications are exempted from the current Restriction of Hazardous Substances Directive (RoHS) regulations because of the lack of a reliable replacement for them, the conversion to lead-free materials in these areas will eventually be implemented and is highly desirable. Lead-free eutectic Au—Sn (280° C.), Au—Si (363° C.), and Au—Ge (356° C.) alloys can be used as die attach solders, but their cost is prohibitive. Although other high temperature lead-free solders in the Sn—Sb, Bi—Ag, Zn—Sn, and Zn—Al systems are also known to be candidates, each has its own drawbacks. For example, the solidus temperatures of Sn—Sb and Zn—Sn alloys are generally too low, Zn—Al alloys are highly corrosive and easily oxidized, and Bi—Ag alloys have brittleness and issues with low thermal/electrical conductivity.

Thus, it can be seen that many of the presently used solder materials are facing the limits of their capabilities, thus compromising device reliability and limiting its service life. There remains a need in the art for an improved solder material that is capable of improving device reliability, especially for high power electronic components.

With the miniaturization of electronic equipment and need to create high power electronic components, the requirement for heat dissipation away from heat generating semiconductor devices has become very critical.

Solders used in die attach and other electrical interconnects perform multiple functions such as providing mechanical strength to join the parts together, providing a path for electrical current, or providing a thermal interface as a route for heat generated in the device to dissipate to a heat sink. Physical properties of the solder material such as thermal conductivity, electrical conductivity, tensile strength, shear strength, creep, and its capacity to form a good interface with devices and circuit boards are important factors in determining its overall performance in the real life application. These properties also need to be stable over time under typical operating conditions.

Electronic devices, especially high power devices such as LED and high power amplifiers and switches etc., generate a lot of heat which need to be dissipated. During operation of such devices, the thermal and electrical interface material sees high temperatures for long periods of time. During high temperature operation, the interconnect material also faces high mechanical stress due to coefficient of thermal expansion (CTE) mismatch between the device, substrate and interconnect materials. Therefore, for long life of the device under operation, the interconnect materials as well as the interfaces should have stable mechanical, thermal and electrical properties under these conditions.

Thermal energy in metals and alloys is primarily transported by electrons. In general, metals and alloys show a decrease in thermal conductivity with increasing temperature. This is usually the result of a combination of several factors such as electron-electron scattering, electron-atom scattering, and electron scattering from the grain boundaries within the alloys and at the interfaces. Changes in conductivity are not desirable. The electrical resistivity of metals and alloys can also change with an increase in temperature. Resistivity changes in the solder alloys are also undesirable.

Suitable interconnect materials and processing techniques therefore remain a major challenge in the design of reliable high-temperature packages for electronic devices and systems. Wide temperature swings and high temperatures substantially increase thermo-mechanical stresses imparted on a device. At elevated temperatures, the solder strength decreases while deformation or creep accelerates, resulting in increased deformation during each load cycle and a reduction in fatigue life. Established solder technologies have failed to overcome such problems and to provide for reliable high temperature operation.

U.S. Pat. No. 8,348,139 to Liu et al., the subject matter of which is herein incorporated by reference in its entirety, describes a laminate composite preform foil for high-temperature lead-free soldering applications.

U.S. Pat. No. 8,034,662 to Tozelbaev et al., the subject matter of which is herein incorporated by reference in its entirety, describes a semiconductor chip thermal interface material method that includes placing a thermal interface material layer containing a support structure on the first semiconductor chip. However, this reference is limited to the use of a mesh which does not allow for the free movement to the solder joint periphery of gas formed during the interaction of the metal oxides and flux during reflow.

Thus, there remains a need in the art for a lead-free solder alloy that is capable of heating dissipation away from heat generating semiconductor devices, that exhibits sufficiently high thermal conductivity and that overcomes the deficiencies of the prior art.

SUMMARY OF THE INVENTION

It is an object of the present invention to provide a solder alloy that is capable of heat dissipation away from heat generating semiconductor devices.

It is another object of the present invention to provide a solder preform that exhibits sufficient thermal conductivity.

It is still another object of the present invention to provide a solder preform that contains a thermal conductivity modifying component.

To that end, in one embodiment, the present invention relates generally to a solder material comprising:

A) a solder alloy, and
B) a thermal conductivity modifying component, wherein the solder material has a bulk thermal conductivity of between about 75 and about 150 W/m-K.

BRIEF DESCRIPTION OF THE DRAWINGS

For a fuller understanding of the invention, reference is made to the following description taken in connection with the accompanying figures, in which.

DETAILED DESCRIPTION OF THE PREFERRED EMBODIMENTS

Figure 1:
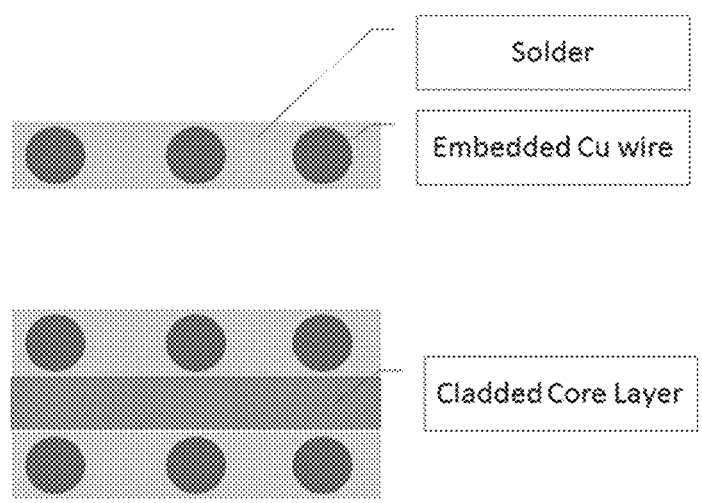
FIG. 1 depicts a schematic of the solder material as described herein with enhanced thermal conductivity. view of the solder material in accordance with one embodiment of the present invention in which copper wire is embedded within the solder alloy and a view of a solder material in accordance with one embodiment of the present invention in which copper wire is embedded in the solder alloy and also containing a cladded core layer.

The present invention relates generally to a solder material for use in electronic packaging, the solder material comprising a solder alloy and a thermal conductivity modifying component. Thus, in one embodiment, the present invention relates generally to a solder preform containing a thermal conductivity modifying component.

As used herein, "a," "an," and "the" refer to both singular and plural referents unless the context clearly dictates otherwise.

As used herein, the term "about" refers to a measurable value such as a parameter, an amount, a temporal duration, and the like and is meant to include variations of +/−15% or less, preferably variations of +/−10% or less, more preferably variations of +/−5% or less, even more preferably variations of +/−1% or less, and still more preferably variations of +1-0.1% or less of and from the particularly recited value, in so far as such variations are appropriate to perform in the invention described herein. Furthermore, it is also to be understood that the value to which the modifier "about" refers is itself specifically disclosed herein.

As used herein, spatially relative terms, such as "beneath", "below", "lower", "above", "upper", "front", "back", and the like, are used for ease of description to describe one element or feature's relationship to another element(s) or feature(s). It is further understood that the terms "front" and "back" are not intended to be limiting and are intended to be interchangeable where appropriate.

As used herein, the terms "comprises" and/or "comprising," specify the presence of stated features, integers, steps, operations, elements, and/or components, but do not preclude the presence or addition of one or more other features, integers, steps, operations, elements, components, and/or groups thereof.

As described herein, the present invention is directed to materials, processes and designs that can be used to improve the performance of a semiconductor to substrate interface, thereby increasing the flow of heat away from the interface and heat generating electronic device.

In one embodiment, the present invention relates generally to a solder material comprising:
A) a solder alloy, and
B) a thermal conductivity modifying component,
wherein the lead-free solder material has a bulk thermal conductivity of between about 75 and about 150 W/m-K.

In one preferred embodiment, the solder material is in the form of a solder preform.

As described herein, in one embodiment, the solder material has a high thermal conductivity, the thermal conductivity being higher than traditional solders used in electronic packaging applications. In one embodiment, the thermal conductivity of the composite solder material is least about 5% greater than traditional solders, or at least about 10% greater than traditional solders, up to about 50% greater than traditional solders, and even higher depending on the thermal conductivity of the solder alloy and the thermal conductivity of the thermal conductivity modifying component.

The solder material provides a metallurgical bond between the substrate and the component in electronic packaging applications. As described herein, it is critical for the composite solder material to have thermal conductivity sufficient to provide connection without creating an excessive thermal barrier.

In one embodiment, the solder alloy of the solder material comprises a conventional soldering material that requires adjustment of thermal conductivity, and the present invention can be used with many common solder alloys to enhance the thermal conductivity and mechanical strength of the solder material beyond the capabilities of the solder itself, including the common die attach solders such as high lead, SnAg, SAC, indium and indium alloys, and SnPb, by way of example and not limitation. In a broad sense, the present invention can be used with any solder alloy in which it is desirable to enhance the thermal conductivity and mechanical strength of the system. Thus, this solder alloy may comprise one or more of tin, copper, silver, bismuth, antimony, indium, gold-tin, lead, germanium, and nickel, by way of example and not limitation. In one embodiment, the solder alloy may comprise a solder alloy as described in U.S. Pat. Pub. No. 2018/0102464 or WO2017/192517, both to de Avila Ribas et al., the subject matter of each of which is herein incorporated by reference in its entirety.

What is important is that the solder alloy is capable of being optimized for heat transfer and reliability with the addition of the thermal conductivity enhancement component described herein.

Table 1 lists some examples of some common solder alloys, many of which are used in die attach and packaged device attach applications. A quick examination of the thermal conductivity values illustrates that indium has one of the highest values at 80 W/m-K. However, indium has a relatively low melt temperature of 156° C., which limits its use in very high power oriented die attach and packaged device attach applications.

TABLE 1

Examples of suitable solder alloys

| Solder Alloy | Melting Range ° C. | Density g/cm$^3$ | CTE ppm/° C. | Tensile Strength Mpa | Modulus Gpa | Thermal Conductivity W/m-° K | Electrical Resistivity μOHM-cm | |
|---|---|---|---|---|---|---|---|---|
| 88Au/12Ge | 356 E | 14.7 | 13 | 185 | 69 | 44 | na | |
| 92.5Pb/2.5Ag/5In | 300 | 11.02 | 25 | 31.4 | na | 25 | na | High |
| 92.5Pb/2.5Ag/5Sn | 287-296 | 11.02 | 29 | 29 | na | 25-27 | na | Lead |
| 88Pb/10Sn/2Ag | 268-299 | 10.77 | 29 | 22.5 | na | 27 | 8.5 | Solders |
| 80Au/20Sn | 280 E | 14.5 | 16 | 276 | 59 | 57 | 16 | |
| 96.5Sn/3.5Ag | 221 E | 7.36 | 30 | 38 | 50 | 61 | 12.5 | SnAg |
| 96.5Sn/3Ag/.5Cu | 217-228 | 7.4 | 22 | 40 | 30 | 60 | 14.5 | and SAC |
| 40In/60Pb | 195-225 | 9.31 | 26 | 34.5 | 7.5 | 19 | 33 | |
| 63Sn/37Pb | 183 E | 8.4 | 25 | 32 | 40 | 50 | na | SnPb |
| 62Sn/36Pb/2Ag | 179 E | 8.41 | 27 | 46 | na | 31 | 14.6 | |
| 100% In | 156.7 | 7.31 | 29 | 2.5 | 1.4 | 80 | 8.8 | Indium |
| 80In/15Pb/5Ag | 148-149 | 7.85 | 26 | 17.5 | 12.8 | 43 | 16 | |
| 97In/3Ag | 146 E | 7.38 | 22 | 5.5 | 2 | 73 | 7.5 | Indium alloy |
| 58Bi/42Sn | 138 E | 8.76 | 14 | 55 | 42 | 19 | 35 | |
| 52In/48Sn | 118 E | 7.3 | 24 | 11.9 | 21.7 | 34 | 15 | |
| 36Sn/36Pb/28Bi | 100 E | 9.34 | 20 | 40.2 | 24 | na | na | |

From Table 1, it can also be seen that typical thermal conductivity values can be as low as 19 W/m-K. These solder alloys are all capable of providing reliable connection with thermal resistance of the joint being low enough to ensure good reliability of many traditional electronic devices. However, their low thermal conductivity makes them unsuitable for use in high power electronic packaging applications.

The bulk properties and interface properties of the solder material described in the present invention are optimal for heat transfer and reliability. To increase the heat flow through the solder alloy, the solder material of the present invention includes a thermal conductivity enhancement component. This thermal conductivity enhancement component preferably has a thermal conductivity of at least about 100 W/m-K, more preferably at least about 200 W/m-K, even more preferably at least about 300 W/m-K, and even more preferably at least about 400 W/m-K.

The inventors of the present invention have found that the choice of materials has a profound effect on the formation of gas during reflow and on the mechanical strength of the joint. For example, bare copper will produce more gas than tin plated copper. Gold is also not a desired material, since it will dissolve into the solder system and embrittle the solder joint, resulting in premature failure in use, especially in power cycling oriented applications. Likewise, aluminum without plating will not wet to solder, resulting in no contribution of the mesh to the structural strength of the solder system. However, aluminum, if plated with nickel and tin, it will wet and form an intermetallic with solder, enhancing the solder system mechanical strength. In contrast, if the wire metal does not wet and form an intermetallic with the solder, the system will be inferior in mechanical strength to the solder without the metal wires.

In a preferred embodiment, the thermal conductivity enhancement component comprises embedded wires because it has been found that the embedded wires increase the bulk thermal conductivity of the solder and provide a path for enhance lateral heat dissipation as well. This is particularly important for eliminating hot spots on the devices with non-uniform heat generation. The wires are also beneficial to control the thickness and uniformity of the solder joint.

Thus, in a preferred embodiment, the thermal conductivity enhancement component consists of wires and the wires are selected from the group consisting of silver, tin over copper, tin over nickel over aluminum, palladium, and platinum. In addition bare copper, bare aluminum and gold are not suitable for use in the present invention for the reasons set forth above.

The amount of thermal conductivity enhancement component in the solder depends on the particular application and thus the desired bulk thermal conductivity of the solder material. The amount of thermal conductivity enhancement component will also depend on the particular composition of the solder alloy and the type of thermal conductivity enhancement component chosen.

For example, in one preferred embodiment, the solder material is in the form of a preform, the preform comprising about 30 wt. % to about 95 wt. % solder alloy and about 70 wt. % to about 5 wt. % thermal conductivity enhancement component, more preferably, about 40 to about 90 wt. % solder alloy and about 60 to about 10 wt. % thermal conductivity enhancement component. The desired amount of thermal conductivity enhancement component is achieved by embedding one or more wires into the solder material. As describe above, the bulk thermal conductivity of the solder material is preferably within the range of about 75 to about 150 W/m-K, more preferably between about 90 and about 110 W/m-K.

The thermal conductivity enhancement component is preferably incorporated into the solder in the form of a wire as shown in FIG. 1.

There are several major enhancements of the present invention over the system described in U.S. Pat. No. 8,034,662. Firstly as discussed above, the thermal conductivity enhancement component of the present invention is in the form of wires. In contrast, U.S. Pat. No. 8,034,662 uses a mesh that is embedded in the solder to set a minimum solder thickness (bondline) and restrict solder movement during melting/reflow. By restricting the movement of the solder during reflow, the metallization of the substrate and die will form a system that will restrict the solder. As long as the bondline thickness is controlled, the solder will wet and adhere to the metallized surfaces and stay in the desired location.

However, the use of the mesh embedded support structure is not desirable in the present invention because the use of the mech would result in a solder joint that would be mechanically inferior to one based on wires. First, the mesh structure does not allow for the free movement to the solder joint periphery of gas formed during the interaction of the metal oxides and the flux during reflow. By using wires as in the present invention, there is one direction whereby the gases formed during reflow can escape the solder joint, thus resulting in less voiding in the joint.

In the present invention, in the case of rectangular solder joints, the wires are oriented parallel to the shorter dimension, to create a shorter path for gases to escape. This is important because if gas is present during solder solidification, voids in the solder joint will result, compromising the mechanical integrity of the joint, reduce the effective thermal conductivity, and reduce the strength of the solder attachment. A shear test of a highly voided solder joints used for die attach results in lower shear force needed to separate the die from the solder. If the voids are positioned under a die hot spot, it can result in a premature failure of the die due to that hot spot, which is why many industry specification regarding voiding state total voids limit, and single largest void limits as well.

The wires of the present invention can be used in parallel and the parallel wires can be packed closer together. This results in a higher percentage of high thermal conductivity material being embedded in the solder system, as compared with a mesh or small posts illustrated in U.S. Pat. No. 8,034,662.

Finally, as discussed above, it has been found that the choice of material for the thermal conductivity enhancement component is critical. In contrast, U.S. Pat. No. 8,034,662 makes no distinction as to the type of mesh metal materials, and exemplary materials that are recited as being suitable include nickel, gold, platinum, silver, palladium, copper, aluminum, combinations of these, and the like.

Figure 2:
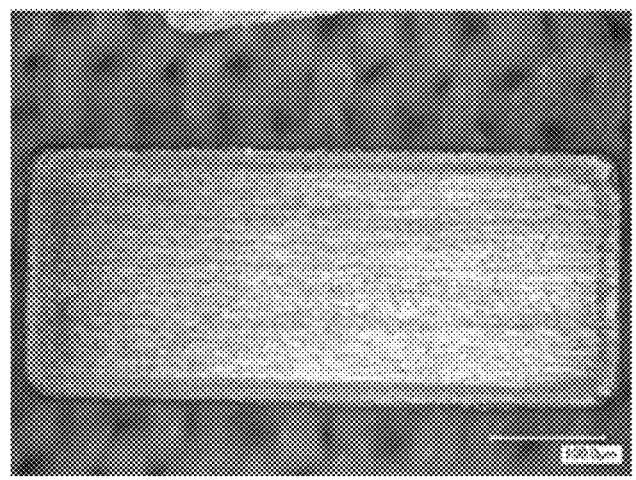
FIG. 2 depicts an optical image of the solder material preform in accordance with one aspect of the present invention.
Figure 3:
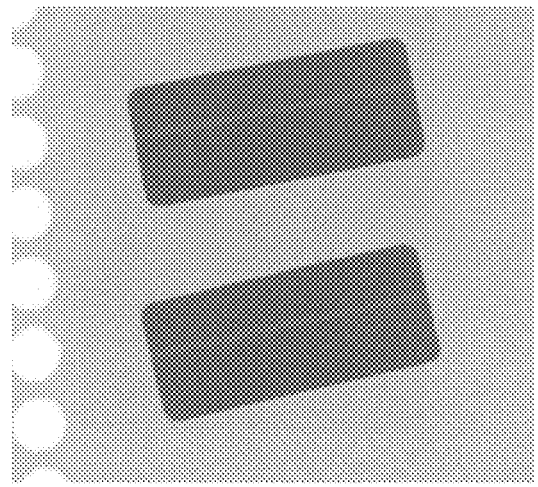
FIG. 3 depicts an X-ray image of the preform of FIG. 2, showing the embedded wire.
Figure 4:
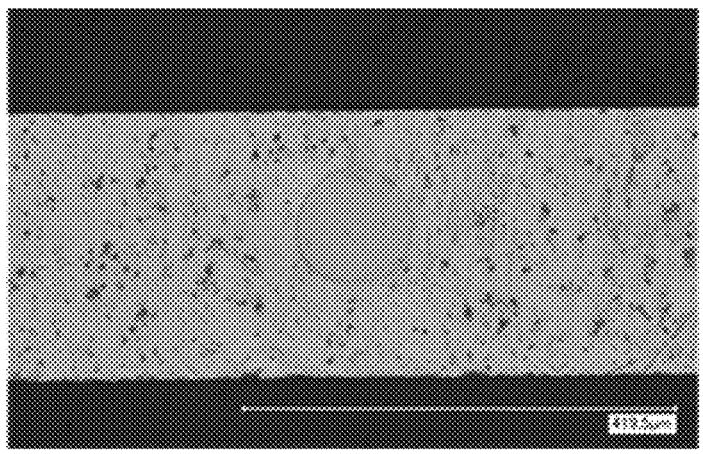
FIG. 4 depicts an optical image of a preform in accordance with the present invention, showing the embedded wire.

FIG. 2 depicts an optical image of the solder material preform in accordance with one aspect of the present invention. In addition, FIG. 3 depicts an X-ray image of the preform of FIG. 2, showing the embedded wire. FIG. 4 depicts an optical image of a preform in accordance with the present invention, showing the embedded wire.

The high thermal conductivity solder materials described herein may be manufactured and applied to the substrate by any applicable method. For example, the wires may be incorporated into the solder alloy by rolling or casting. Other methods would also be known to those skilled in the art and applicable to the present invention.

To ensure good processability, the wires can be precoated with a solder alloy by electroplating, sputtering or other known techniques. This solder alloy is preferably the same solder alloy as the base solder alloy to ensure that there are not any issues with compatibility.

The diameter of the wire can vary between about 5 to about 200 microns, more preferably, between about 25 to about 150 microns, and even more preferably between about 50 to about 125 microns. The resulting solder joint is of about the same thickness as is typical for many electronic applications.

Figure 5A:
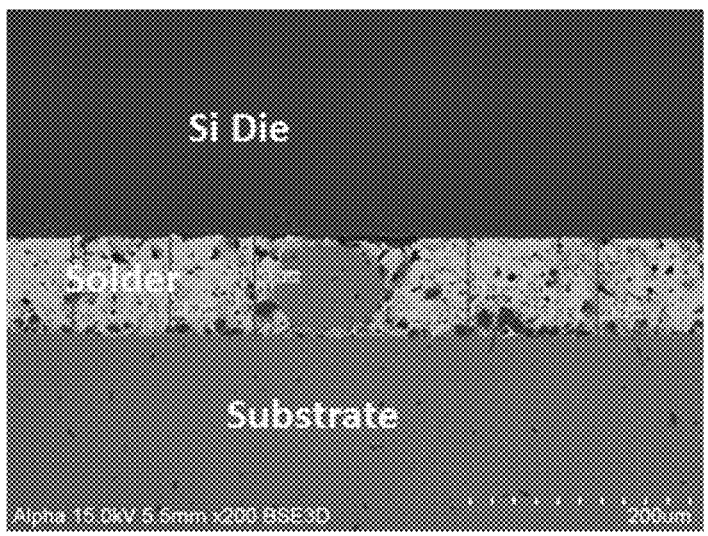
FIGS. 5A and 5B depict SEM images of a silicon die attached to a substrate using the solder material of the present invention.
Figure 5B:
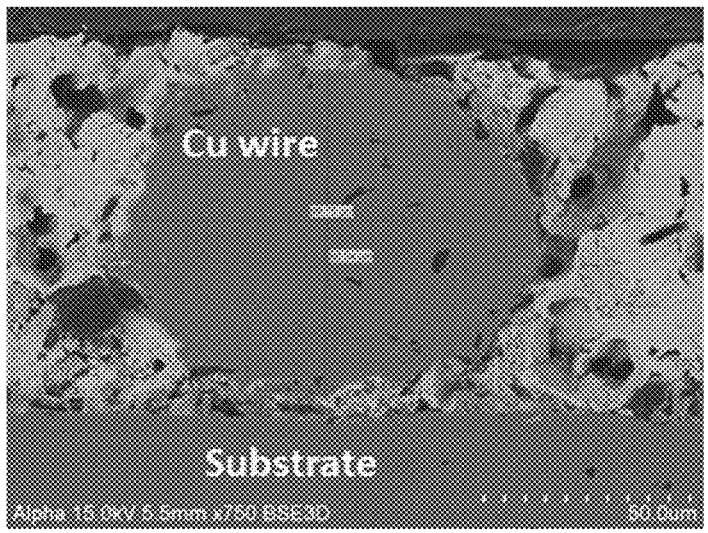

The solder joint can be created by applying a solder paste and/or a solder preform to the substrate. During reflow process, the solder melts and creates the joint between the substrate and the component. FIGS. 5A and 5B depict SEM images of a silicon die attached to a substrate using the solder material of the present invention.

The solder material described herein is usable in all known assembly processes, including, but not limited to reflow and vacuum ovens.

The invention will now be discussed in relation to the following non-limiting examples.

Example 1

This example illustrates the calculation of the resultant thermal conductivity change of a copper wire embedded preform as compare with a solder only preform. In this example, three copper wires of µm diameter were embedded in a solder preform of dimensions 1000×1000×200 µm.

Volume of system: 1000 µm×1000 µm×200 µm=200×10⁶ µm³

Volume of copper: 3×πr²h=3×π(50 µm)²×1000 µm=23.5×10⁶ µm³

Volume of solder: (200−23.5)×10⁶ µm³

Thermal conductivity of copper ($Cu_{TC}$): 400 W/m-K

Thermal conductivity of solder ($Solder_{TC}$): 50 W/m-K (Volume of Cu)/total volume×$Cu_{TC}$+(Volume of solder)/total volume×$Solder_{TC}$=Total (Bulk) Thermal conductivity=91 W/m-K.

Example 2

Example 2 demonstrates the enhancement of the thermal conductivity of a typical higher melt temperature solder, such as SnAg3.5 solder with a thermal conductivity enhancement component comprising silver wires. Table 2 illustrates that by adding 5 silver wires to the solder, the resultant thermal conductivity of the system is increased to 88.1 W/m-K, which exceeds the value of indium. In addition, this system has a melting temperature of 221'C, which is capable of supporting a maximum die operating temperature of 175° C. In contrast, an indium alloy can only support a die operating temperature of about 110° C.

Replacing the silver wires with tin plated copper wires would result in a slightly smaller overall thermal conductivity value, but still result in enhanced thermal conductivity as with a SnAg3.5 solder alloy without thermal enhancement.

Thus it can be seen that the use of a thermal conductivity enhancement component in a solder alloy material enhances the thermal conductivity of the system and allows for optimal heat transfer and reliability.

Finally, it should also be understood that the following claims are intended to cover all of the generic and specific features of the invention described herein and all statements of the scope of the invention that as a matter of language might fall there between.

What is claimed is:

1. A solder material comprising:
   a) a solder alloy, and
   b) a thermal conductivity modifying component,
   wherein the solder alloy is selected from the group consisting of high lead alloys, SnAg alloys, SnAgCu alloys, SnPb alloys, and combinations of one or more of the foregoing;
   wherein the thermal conductivity modifying component is in the form of a wire;
   wherein the thermal conductivity modifying component is tin over nickel over aluminum; and
   wherein the solder material has a bulk thermal conductivity of between about 75 and about 150 W/m-K.

2. The solder material according to claim 1, wherein the solder alloy has a thermal conductivity of between about 20 and about 70 W/m-K.

3. The solder material according to claim 2, wherein the solder alloy has a thermal conductivity of between about 25 and about 60 W/m-K.

4. The solder material according to claim 1, wherein the thermal conductivity modifying component has a thermal conductivity of at least 100 W/m-K.

5. The solder material according to claim 4, wherein the thermal conductivity modifying component has a thermal conductivity of at least 200 W/m-K.

6. The solder material according to claim 5, wherein the thermal conductivity modifying component has a thermal conductivity of at least 300 W/m-K.

7. The solder material according to claim 1, wherein the solder material has a bulk thermal conductivity of between about 80 and about 110 W/m-K.

8. The solder material according to claim 1, wherein the solder material is in the form of a solder preform.

9. The solder material according to claim 1, wherein the lead-free solder material comprises between about 30 wt. %

TABLE 2

Enhancement of thermal conductivity of SnAg3.5 alloy with silver wires

|  | Quantity | Length mm | Width mm | Thickness mm | Volume | % | Thermal Conductivity W/m-K | Contribution W/m-K |
|---|---|---|---|---|---|---|---|---|
| Total System |  | 5 | 5 | 0.1 | 2.50 |  |  |  |
|  |  | Length | Diameter |  |  |  |  |  |
| Embedded Ag Wires | 5 | 5 | 0.1 |  | 0.20 | 7.9% | 406 | 31.9 |
| Solder SnAg3.5 |  |  |  |  | 2.30 | 92.1% | 61 | 56.2 |
|  |  |  |  |  |  |  |  | 88.1 | to about 95 wt. % of the solder alloy and about 70 wt. % to about 5 wt. % of the thermal conductivity modifying component.

10. The solder material according to claim 1, wherein the wire comprises a plurality of wires that are used in parallel and the parallel wires are packed close together.

11. A solder joint comprising the solder material of claim 1.

12. The solder joint according to claim 11, wherein the solder joint is rectangular and the wire is oriented parallel to a shorter dimension of the rectangular, wherein the wire creates a shorter path for gases to escape.

13. A method of making a solder joint between a substrate and a component, the method comprising the steps of:
  a) applying the solder material of claim 1 to a substrate;
  b) disposing a component on the solder material; and
  c) reflowing the solder material to create the solder joint between the substrate and the component.

\* \* \* \* \*